United States Patent [19]

Monk

[11] Patent Number: 4,627,028

[45] Date of Patent: Dec. 2, 1986

[54] MEMORY DECODER CIRCUIT

[75] Inventor: Trevor K. Monk, Bexley, England

[73] Assignee: Standard Telephones and Cables, Public Limited Company, London, England

[21] Appl. No.: 578,946

[22] Filed: Feb. 10, 1984

[30] Foreign Application Priority Data

Feb. 11, 1983 [GB] United Kingdom ............. 8303886

[51] Int. Cl.$^4$ .............................................. G11C 5/06
[52] U.S. Cl. ....................................... 365/72; 365/51; 365/63
[58] Field of Search ................... 365/51, 63, 72, 230

[56] References Cited

U.S. PATENT DOCUMENTS 4,145,622  3/1979  Hofmann et al. ............. 365/230 X

FOREIGN PATENT DOCUMENTS 0046629   3/1982   European Pat. Off. .
2004691B  4/1979   United Kingdom .
2074790B  11/1981  United Kingdom .
2077490A  12/1981  United Kingdom .

Primary Examiner—Joseph A. Popek
Attorney, Agent, or Firm—Kerkam, Stowell, Kondracki & Clarke

[57] ABSTRACT

In an NOR decoder for a static random access memory the individual transistor gates (30) are coupled to metallization tracks (31) via polysilicon contact islands (33). The gates of selected transistors are divided into two portions (20a, 20b) disposed on diametrically opposite sides of the corresponding islands (33). This arrangement allows a closer spacing of the tracks (31) than is achieved in conventional layouts.

3 Claims, 3 Drawing Figures

MEMORY DECODER CIRCUIT

This invention relates to semiconductor memory devices, and in particular to the fabrication of decoder circuits for such memories.

There is a continuous trend in semiconductor memory design to reduce the physical dimensions of the various components and thus increase the number of components that can be accommodated in a given chip area. A major problem that has been experienced with this increase of component density has been the provision of conductor tracks to the various circuit regions. To prevent the risk of shorting and/or capacitive coupling between adjacent tracks there is a minimum track spacing below which there is a risk of severe reduction in the yield of the finished circuit.

This limitation has proved a particular constraint on the design of NOR decoder circuits for static random access memories. Such decoders usually comprise a plurality of parallel gates which gates are laid out around a central decoding node. In a typical arrangement pairs of metal address lines run orthogonally across the decoder gates and a contact is made from each gate to one of the corresponding address lines.

Under some circumstances, the length of the gate and the length of the contact island cause some of the metal address lines to be spaced at more than the minimum spacing. This is inefficient use of area in the metal layer and limits the density of integration that may be achieved.

The object of the present invention is to minimise or to overcome this disadvantage.

According to one aspect of the invention there is provided an integrated circuit including a semiconductor substrate, a plurality of field effect transistors disposed on said substrate, a plurality of parallel metallisation tracks, and contact islands one for each transistor whereby that transistor gate is coupled to a said track, wherein the gates of at least some of said transistors are divided into first and second portions disposed on diametrically opposite sides of the corresponding contact island.

According to another aspect of the invention there is provided an NOR decoder circuit for a random access memory, the decoder circuit including a plurality of field effect transistor circuits each coupled between the circuit ground and a decoding node, wherein the gates of each said transistors are divided each into first and second portions disposed on diametrically opposite sides of a contact island whereby that transistor gate is coupled to a conductor track.

The arrangement allows a closer spacing of the conductor tracks than may be achieved with conventional layouts and thus reduces the chip area required.

An embodiment of the invention will now be described with reference to the accompanying drawings in which.

Figure 3:
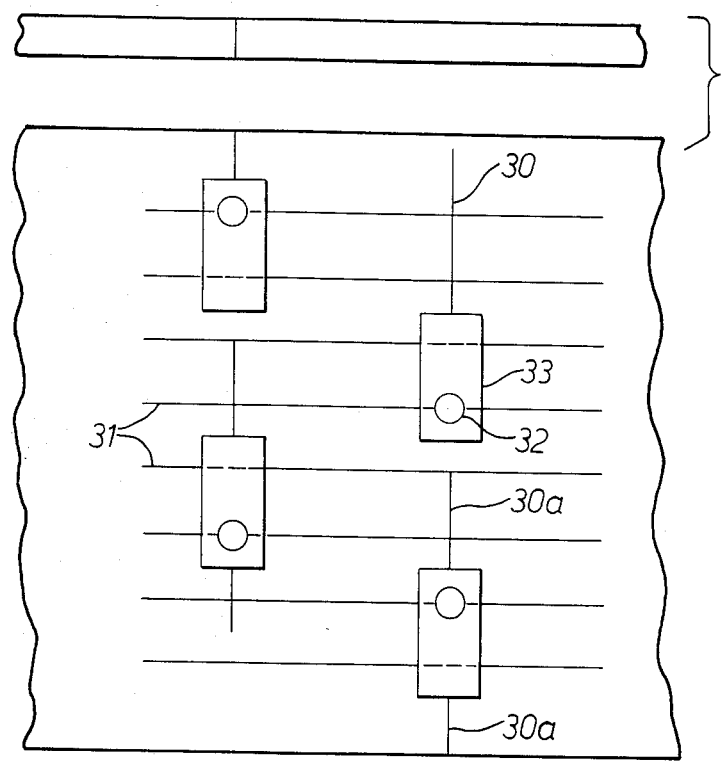

and FIG. 3 shows the gate layout according to the present invention.

Figure 1:
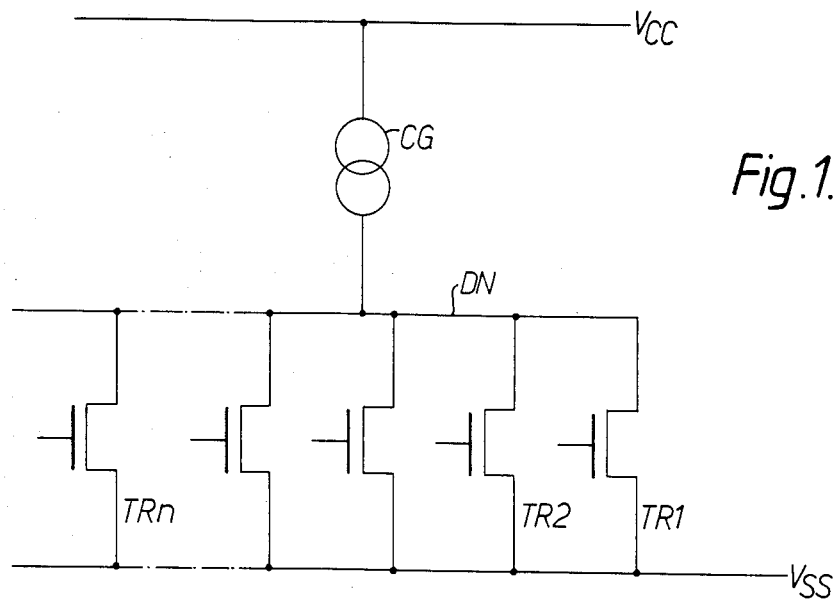
FIG. 1 is a partly schematic diagram of the NOR decoder circuit.

Referring to FIG. 1, the decoder circuit includes a plurality of field effect transistors TR1, TR2,—TRN, one for each address input bit coupled between the circuit ground Vss and a decoding node DN. The node DN is coupled to the circuit power supply Vcc via a current generator CG and feeds an output buffer (not shown).

In the normal or standby condition of the circuit the decoder node is in a low voltage state, i.e. substantially at the circuit ground potential, and switches to its high voltage state only when all the address inputs are low simultaneously, i.e. when all the transistors TR1 and TRN are turned off allowing the potential of the node to rise.

A circuit of this type, together with an associated voltage clamp circuit, is described in our UK application No. 8236510 (T. K. Monk 5). It will however be appreciated that the present invention is not limited to this particular decoder circuit arrangement.

Figure 2:
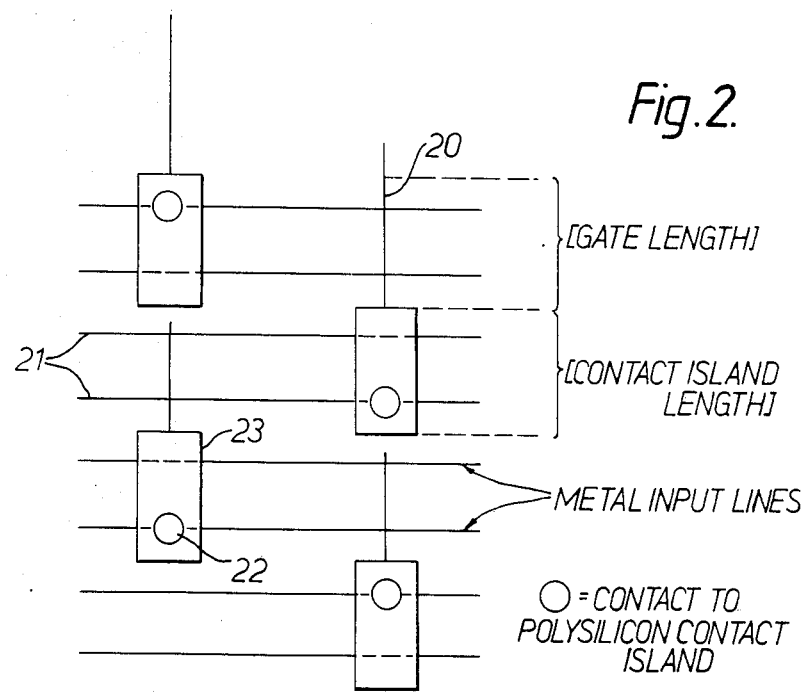
FIG. 2 shows a conventional gate layout of the circuit of FIG. 1.

FIG. 2 shows a conventional schematic layout of the transistor gates of the circuit of FIG. 1. The gates 20 are arranged around a decoder node and each is connected to an overlying metallisation track or address line 21 via a contact 22. The tracks 21 provide the input lines and are disposed in a parallel spaced array across the circuit. Each gate 20 is provided with a polysilicon contact island 23 whereby contact between the gate region and the contact 22 is effected.

The track spacing is limited by the total of the gate and contact island length.

FIG. 3 shows an arrangement in which the track spacing is reduced. As before the gates 30 are connected each to a metallisation track 31 via a contact 32. Each gate is provided with a polysilicon contact island 33 whereby contact between the gate and the contact 32 is provided.

To minimise the spacing between the metallisation tracks 31 and thus increase the circuit density selected gate regions, 30a, are divided into two portions disposed either side of the contact island. With this arrangement the 'waste' area now appears at one edge of the metal layout, i.e. at the bottom of FIG. 3. Since this 'waste' area can be used to accommodate further metal track, e.g. clock lines, associated with other circuit regions a significant increase in circuit complexity can be obtained.

I claim:

1. An integrated circuit including a semiconductor substrate, a plurality of field effect transistors disposed on said substrate, a plurality of parallel metallisation tracks on said substrate for interconnecting said transistors, each transistor having a gate coupled to a said track, a contact island for each transistor for coupling said gate to a said track, and the gate of at least some of said transistors including first and second portions disposed on diametrically opposite sides of the corresponding contact island.

2. In a random access memory a NOR decoder circuit including a plurality of field effect transistor circuits each coupled between a circuit ground and a decoding node, each of said transistors having a gate divided into first and second portions disposed on diametrically opposite sides of a contact island whereby that transistor gate is coupled to a conductor track.

3. A decoder circuit as claimed in claim 2, wherein said memory is a static random access memory.

* * * * *